United States Patent
Park

(10) Patent No.: US 9,577,059 B2
(45) Date of Patent: Feb. 21, 2017

(54) NON-VOLATILE MEMORY DEVICE AND METHOD OF FABRICATING THE SAME

(71) Applicant: SK hynix Inc., Gyeonggi-do (KR)

(72) Inventor: Sung-Kun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/056,542

(22) Filed: Oct. 17, 2013

(65) Prior Publication Data

US 2014/0367761 A1    Dec. 18, 2014

(30) Foreign Application Priority Data

Jun. 13, 2013 (KR) .................. 10-2013-0067738

(51) Int. Cl.
*H01L 29/423* (2006.01)
*H01L 29/788* (2006.01)
*H01L 27/115* (2006.01)

(52) U.S. Cl.
CPC ... *H01L 29/42324* (2013.01); *H01L 27/11519* (2013.01); *H01L 27/11521* (2013.01); *H01L 27/11543* (2013.01); *H01L 29/7881* (2013.01)

(58) Field of Classification Search
CPC ............. H01L 27/115; H01L 27/11517; H01L 27/11519; H01L 29/42324; H01L 29/42328
USPC ................................. 257/316, 319
See application file for complete search history.

(56) References Cited

U.S. PATENT DOCUMENTS

| | | | | |
|---|---|---|---|---|
| 5,255,219 A * | 10/1993 | Sakai | .................. | 365/185.32 |
| 6,465,833 B1 * | 10/2002 | Jung | ................. | H01L 21/28273 |
| | | | | 257/314 |
| 6,696,724 B2 * | 2/2004 | Verhaar | ................. | 257/314 |
| 6,788,576 B2 | 9/2004 | Roizin | | |
| 7,259,419 B2 * | 8/2007 | Koo | ................. | H01L 27/105 |
| | | | | 257/314 |
| 7,671,396 B2 | 3/2010 | Fenigstein et al. | | |
| 7,746,696 B1 | 6/2010 | Paak | | |
| 7,859,043 B2 | 12/2010 | Pikhay et al. | | |
| 7,880,215 B2 * | 2/2011 | Watanabe | ......... | G11C 16/0408 |
| | | | | 257/314 |
| 8,436,411 B2 * | 5/2013 | Lin | ................. | H01L 29/42332 |
| | | | | 257/315 |
| 8,890,230 B2 * | 11/2014 | Hsu et al. | ................. | 257/315 |
| 2006/0157773 A1 * | 7/2006 | Yu et al. | ................. | 257/314 |
| 2014/0145293 A1 | 5/2014 | Jain et al. | | |

FOREIGN PATENT DOCUMENTS

KR   1020050005057   1/2005
KR   1020140081398   7/2014

OTHER PUBLICATIONS

Sung, H., et al., Novel Single-Poly EEPROM With Damascene Control-Gate Structure, IEEE Electron Device Letters, Oct. 2005, pp. 770-772, vol. 26, No. 10.

(Continued)

*Primary Examiner* — Karen Kusumakar
(74) *Attorney, Agent, or Firm* — IP & T Group LLP

(57) ABSTRACT

A non-volatile memory device may include a control plug formed over a substrate. A floating gate may be formed over the substrate, the floating gate surrounding the control plug and being separated from the control plug by a gap. A first charge blocking layer may be formed over sidewalls of the floating gate to fill the gap.

18 Claims, 15 Drawing Sheets

(56) References Cited

OTHER PUBLICATIONS

Lien, C., et al., A New 2T Contact Coupling Gate MTP Memory in Fully CMOS Compatible Process, IEEE Transactions on Electron Devices, Jul. 2012, pp. 1899-1905, vol. 59, No. 7.
Office Action issued by the United States Patent and Trademark Office for a continuation-in-part U.S. Appl. No. 14/612,014 on Apr. 6, 2016.

* cited by examiner

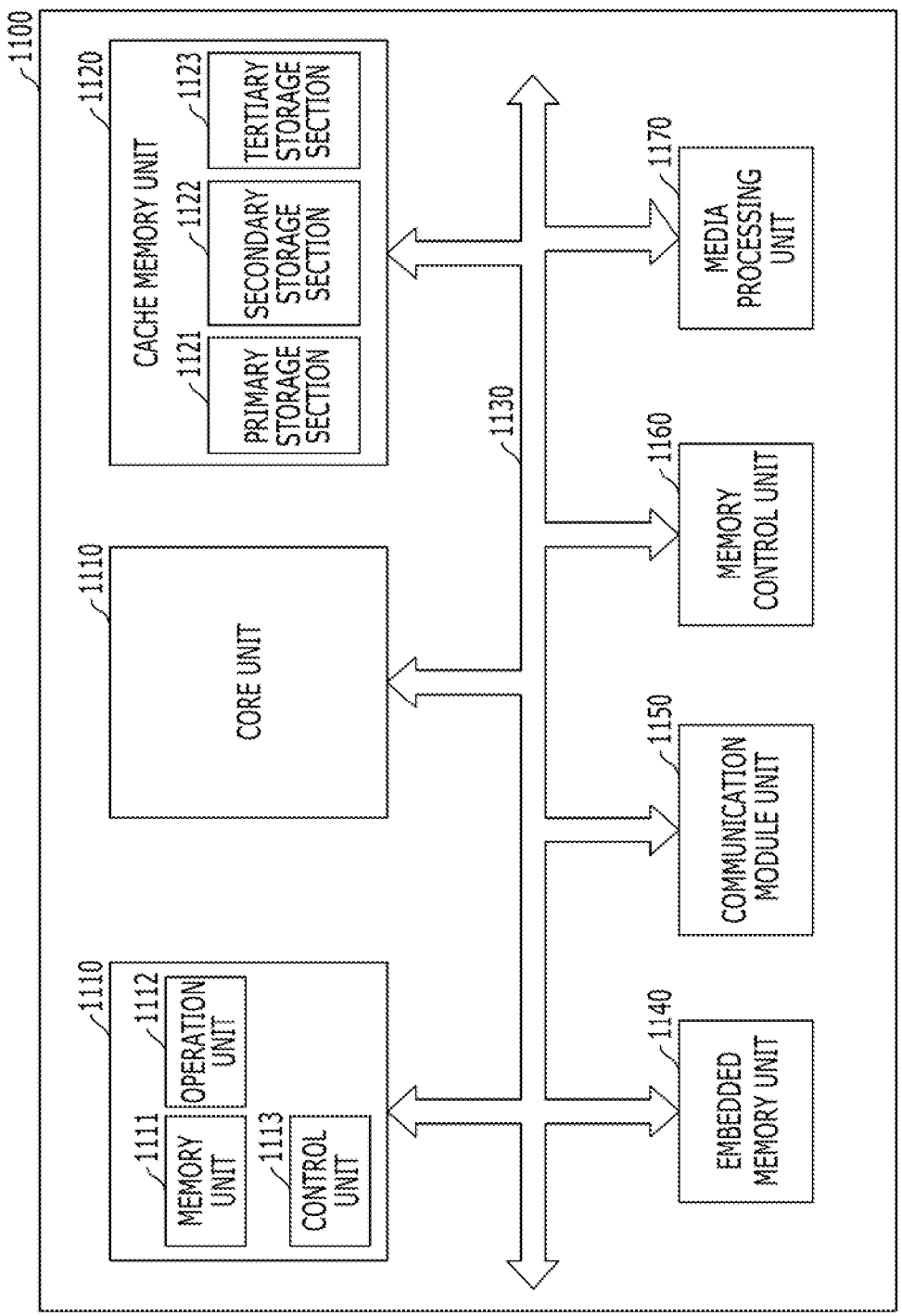

NON-VOLATILE MEMORY DEVICE AND METHOD OF FABRICATING THE SAME

CROSS-REFERENCE TO RELATED APPLICATIONS

The present application claims priority of Korean Patent Application No. 10-2013-0067738, filed on Jun. 13, 2013, which is incorporated herein by reference in its entirety.

BACKGROUND

1. Field

Exemplary implementations of the present invention relate to a semiconductor device fabrication technology, and more particularly, to a non-volatile memory device and a method of fabricating the same.

2. Description of the Related Art

Recent digital media devices allow people to readily use information they want anywhere at any time. As various devices are converted from analog to digital and the digital devices are propagating rapidly, storage media for simply storing video, recorded music, and diverse data are required. Meanwhile, a non-memory semiconductor field also pays attention to System on Chip (SoC) to keep the pace with the trend of high integration, and the global semiconductor industries are competitively making an investment in SoC foundation technology. The SoC is a technology of integrating all system technologies into a single semiconductor. Without system designing technology, it is difficult to develop non-memory semiconductor.

As a chip having a complex function of both digital circuit and analog circuit emerges as mainstream technology in the SoC field where complicated technologies are integrated, there is an increasing demand for an embedded memory for trimming an analog device or storing an internal operation algorithm.

Since embedded memories are fabricated based on a logic process or a CMOS process for forming a logic circuit, it is difficult to improve the integration degree and operation characteristics of the embedded memories. To solve this problem, in other words, to improve the integration degree and operation characteristics of the embedded memories, it is inevitable to add other processes in addition to a predetermined logic process. However, procedural variables of the processes added to the predetermined logic process deteriorate not only the embedded memory but also the characteristics of a device including an embedded memory.

SUMMARY

An exemplary non-volatile memory device may include a control plug formed over a substrate; a floating gate formed over the substrate, the floating gate surrounding the control plug and being separated from the control plug by a gap; and a first charge blocking layer formed over sidewalls of the floating gate to fill the gap.

An exemplary non-volatile memory device may include an isolation layer formed in a substrate to define an active region; a control plug formed over the isolation layer; a floating gate formed over the isolation layer, the floating gate surrounding the control plug and being separated from the control plug by a gap, and the floating gate extending over the active region; and a first charge blocking layer formed over sidewalls of the floating gate to fill the gap.

An exemplary non-volatile memory device may include an isolation layer formed in a substrate to define a plurality of active regions; a plurality of control plugs symmetrically arranged, over the isolation layer, with respect to the plurality active regions; a plurality of floating gates asymmetrical arranged with respect to the active regions, each floating gate, of the plurality of floating gates, surrounding a corresponding control plug, of the plurality of control plugs, and being separated from the corresponding control plug by a gap, and each floating gate, of the plurality of floating gates extending over a corresponding active region; and a first charge blocking layer formed over sidewalls of each floating gate, of the plurality of floating gates, to fill the gap.

An exemplary method of fabricating a non-volatile memory device may include forming an isolation layer in a substrate having a logic region and a memory region; simultaneously forming floating gates in the memory region and logic gates in the logic region; forming spacers on sidewalls of the logic gates and the floating gates; forming an interlayer dielectric layer over the substrate; and simultaneously forming control plugs that penetrate through the interlayer dielectric layer to contact the spacers on the sidewalls of the floating gates, and forming contact plugs that penetrate through the interlayer dielectric layer to contact the active regions.

Each of the floating gates may surround a corresponding contact plug. Each floating gate may have sidewalls facing sidewalls of a corresponding control plug. Each control plug may include at least two plugs having sidewalls facing the sidewalls of each floating gate.

An exemplary microprocessor may include a control unit configured to receive a signal including an external command, and to perform extraction, decoding, or controlling of input and output based on the external command; an operation unit configured to perform an operation in response to a signal of the control unit; and a memory unit configured to store any of (i) data for performing the operation, (ii) data corresponding to a result of performing the operation, or (iii) an address of data for which the operation is performed, wherein the memory unit comprises a control plug formed over a substrate; a floating gate formed over the isolation layer, the floating gate surrounding the control plug and being separated from the control plug by a gap, and the floating gate extending over the active region; and a first charge blocking layer formed over sidewalls of the floating gate to fill the gap.

An exemplary processor may include a core unit configured to perform, in response to an external command, an operation corresponding to the external command, by using data; an embedded memory unit configured to store the data; a cache memory unit configured to store any of (i) data for performing the operation, (ii) data corresponding to a result of performing the operation, or (iii) an address of data for which the operation is performed; and a bus interface connected between the core unit, the embedded memory unit and the cache memory unit, and configured to transmit data between the core unit and the cache memory unit, wherein the embedded memory unit comprises a control plug formed over a substrate; a floating gate formed over the isolation layer, the floating gate surrounding the control plug and being separated from the control plug by a gap, and the floating gate extending over the active region; and a first charge blocking layer formed over sidewalls of the floating gate to fill the gap.

BRIEF DESCRIPTION OF THE DRAWINGS

FIG. 7 is a configuration diagram of an exemplary processor.

DETAILED DESCRIPTION

Figure 1A:
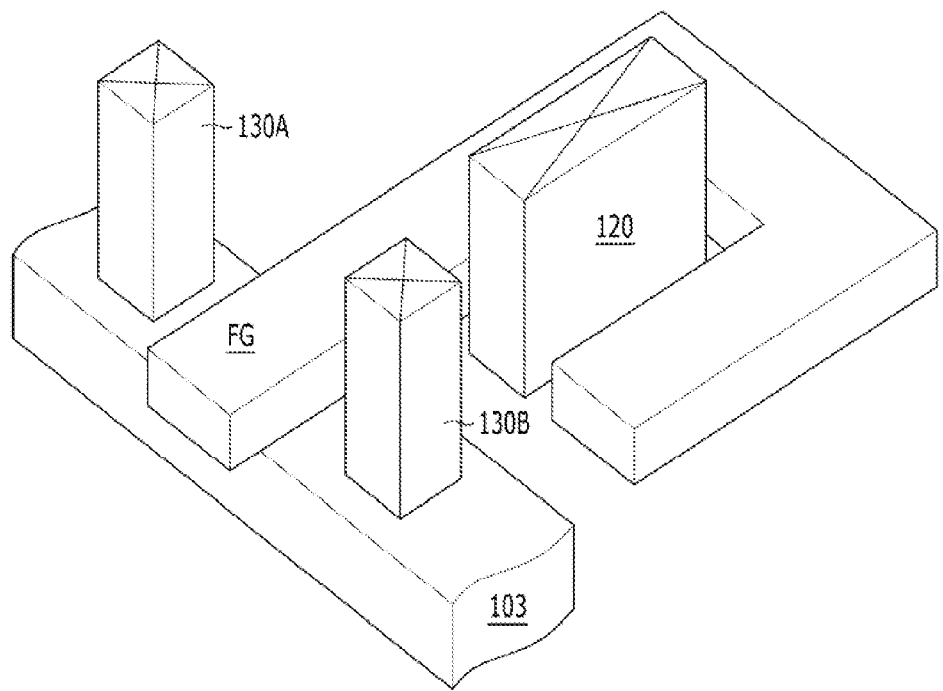
FIGS. 1A to 1D illustrate a unit cell of an exemplary non-volatile memory device.

Exemplary implementations of the present invention will be described below in more detail with reference to the accompanying drawings. The present invention may, however, be embodied in different forms and should not be construed as limited to the implementations set forth herein. Rather, these implementations are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the implementations. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Described hereafter is a non-volatile memory device that may be easily applied to an embedded memory using System on Chip (SoC) technology, and a method for fabricating the non-volatile memory device. To this end, the implementations of the present invention provide a non-volatile memory device, such as a flash EEPROM, which may be fabricated without an additional process added to a logic process. The flash EEPROM has an integration degree more improved than the single gate EEPROM, and a method for fabricating the non-volatile memory device.

The flash EEPROM is a highly integrated non-volatile memory device that may store data and electrically erase and program data even without a power supplied thereto. EEPROMs may include: a single gate EEPROM having one gate, e.g., a floating gate; a stack gate (ETOX) EEPROM having two gates, e.g., a floating gate and a control gate, that are vertically stacked one on the other; a dual gate EEPROM, which corresponds an intermediate form between the single gate EEPROM and the stack gate EEPROM; or a split gate EEPROM. The known single gate EEPROM uses an impurity region, such as a well formed in a substrate, to couple the floating gate to a voltage terminal. For this reason, the single gate EEPROM does not require an additional process that is performed in addition to the logic process, but it has limitation in improving the operation characteristics and integration degree. Conversely, the stack gate EEPROM, which has a floating gate and a control gate that are vertically stacked, the dual gate EEPROM, where a floating gate and a control gate are disposed in parallel, or the split gate EEPROM, where a control gate covers a side of a floating gate, all include a control gate. Therefore, the operation characteristics and integration degree may be improved, but since the predetermined logic process cannot form the floating gate and the control gate simultaneously, they require an additional process that is performed other than the predetermined logic process.

Therefore, the implementations of the present invention described below provide non-volatile memory devices including control plugs that may be formed through the predetermined logic process while functioning as floating gates and control gates for coupling the floating gates to a voltage terminal so that an additional process is not required other than the predetermined logic process while improving the operation characteristics and the integration degree at the same time, and methods for fabricating the non-volatile memory devices.

Meanwhile, in the following description, a first conductive type is complement to a second conductive type. In other words, if the first conductive type is a P-type, then the second conductive type is an N-type, and if the first conductive type is an N-type, then the second conductive type is a P-type. This means that the exemplary non-volatile memory device may have an N-type channel or a P-type channel. For the sake of convenience in description, it will be assumed that the first conductive type is a P-type and the second conductive type is an N-type. However, the invention is not so limited. In short, an N-type channel non-volatile memory device is taken as an example and described hereafter.

Figure 1B:
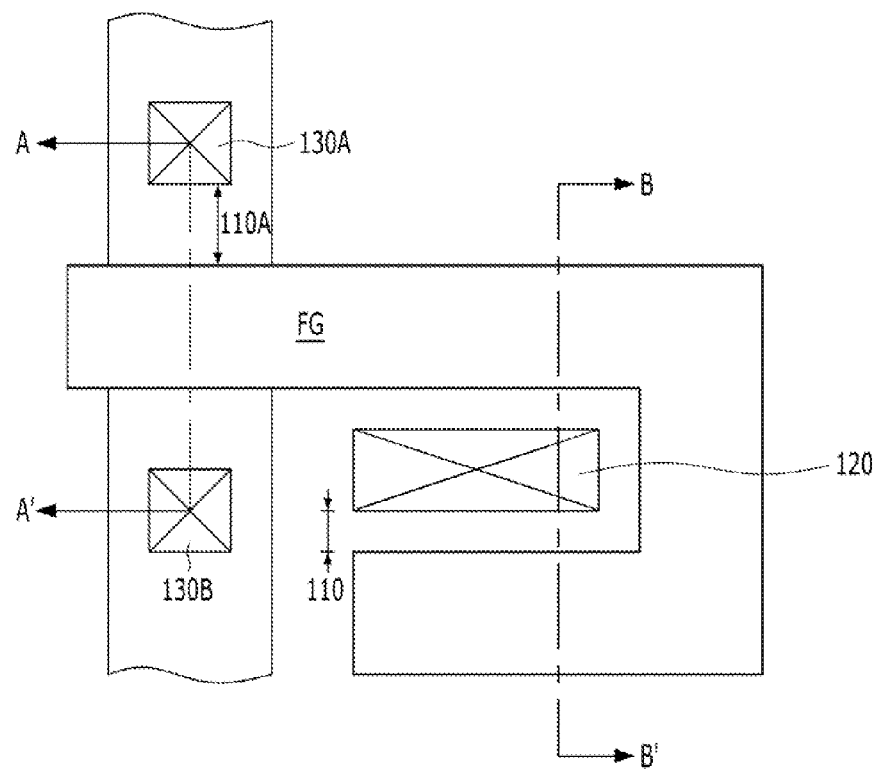
Figure 1C:
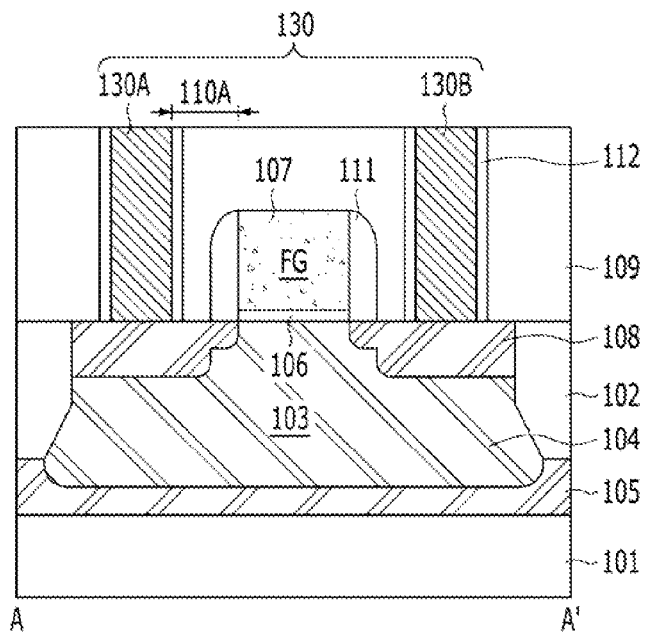
Figure 1D:
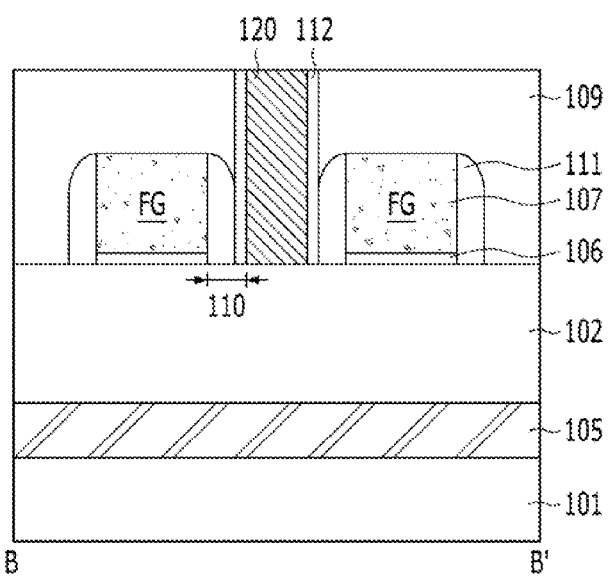
Figure 2A:
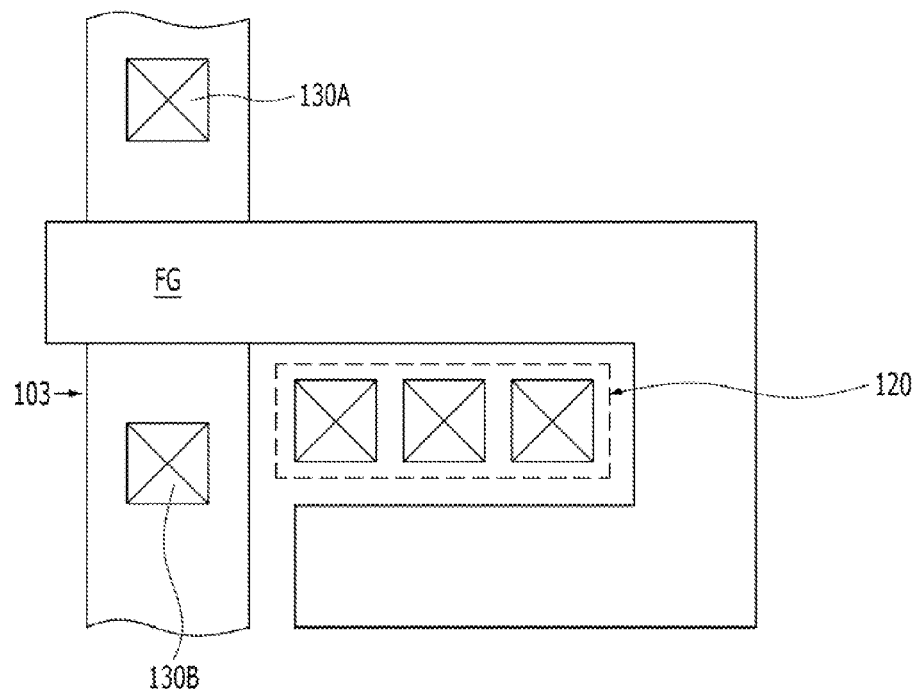
FIGS. 2A to 2E are plan views illustrating a modified example of the exemplary non-volatile memory device.
Figure 2B:
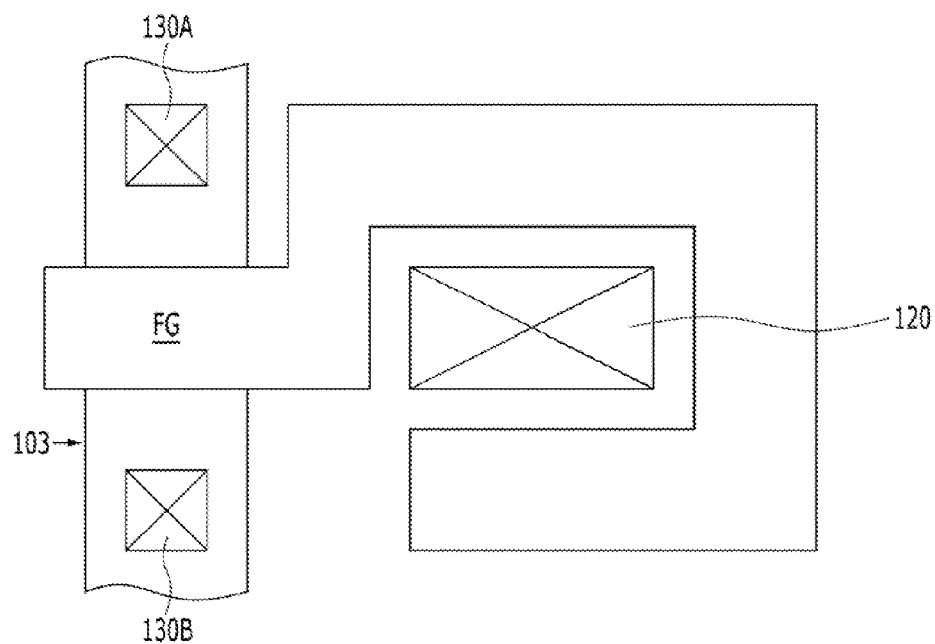

FIGS. 1A to 1D illustrate a unit cell of an exemplary non-volatile memory device. FIG. 1A is a perspective view, and FIG. 1B is a plan view. FIGS. 1C and 1D are cross-sectional views of the unit cell taken along a line A-A' and a line B-B', shown in FIG. 1B. FIGS. 2A and 2B are plan views illustrating a modified example of the exemplary non-volatile memory device.

Referring to FIGS. 1A to 1D, the exemplary non-volatile memory device may include an isolation layer 102 (shown in FIG. 1C) formed in a substrate 101 to define an active region 103, a control plug 120 formed over the isolation layer 102, a floating gate FG formed over the isolation layer 102, spaced from the control plug 120 by a gap 110, surrounding the neighboring control plug 120, and having a portion extending onto the active region 103, and a first charge blocking layer 111 formed on the sidewalls of the floating gate FG and filling the gap 110. The non-volatile memory device may further include a junction region 108 of a second conductive type formed in the active region 103 on both sides of the floating gate FG, a contact plug 130 formed over the junction region 108, a second charge blocking layer 112 formed on the sidewalls of the control plug 120 and of the contact plug, and an interlayer dielectric layer 109 formed over the substrate 101.

Also, the exemplary non-volatile memory device may include an isolated well 104 of a first conductive type and a deep well 105 of a second conductive type that are formed in the substrate 101. The substrate 101 may be a semiconductor substrate. The semiconductor substrate may be of a monocrystalline state and it may include a silicon-containing material. In other words, the semiconductor substrate may include a monocrystalline silicon-containing material. For example, the substrate 101 may be a bulk silicon substrate, a support substrate, or a Silicon on Insulator (SOI) substrate, where a support substrate, a buried insulation layer, and a monocrystalline silicon layer are sequentially stacked. The isolated well 104 and the deep well 105 provide a base where a memory device operates. The isolated well 104 and the deep well 105 may be formed through an ion implantation process. The deep well 105 may be selectively formed according to the operation method (e.g., an erase method) of the non-volatile memory device, and a plurality of isolated wells 104 may be formed in the inside of the deep well 105. Herein, the non-volatile memory device including the deep well 105 may use an FN tunneling method, for example, during an erase operation.

In the exemplary non-volatile memory device, the isolation layer 102 may be formed through a Shallow Trench Isolation (STI) process, and it may include an insulation substance. The active region 103, defined by the isolation layer 102, may be of a bar type or a line type having a long axis and a short axis. The junction region 108 may be formed in the active region 103 on both sides of the floating gate FG, and the active region 103 may further include a protrusion (not shown) extending in the direction of the short axis to help a contact easily formed between the junction region 108 and the contact plug 130 (or a conductive line).

In the exemplary non-volatile memory device, the control plug 120, which is formed over the isolation layer 102, may perform the function of a control gate that couples the floating gate FG to a voltage terminal to which a bias applied during a program operation, an erase operation, or a read operation. In other words, the floating gate FG may be controlled in response to the bias applied to the control plug 120 through the voltage terminal. Herein, the control plug 120 is disposed over the isolation layer 102 to increase the degree of freedom to the bias applied to the control plug 120. In short, since the control plug 120 is disposed over the isolation layer 102, it is free from the polarity, e.g., positive or negative, of the bias applied to the control plug 120.

Figure 2C:
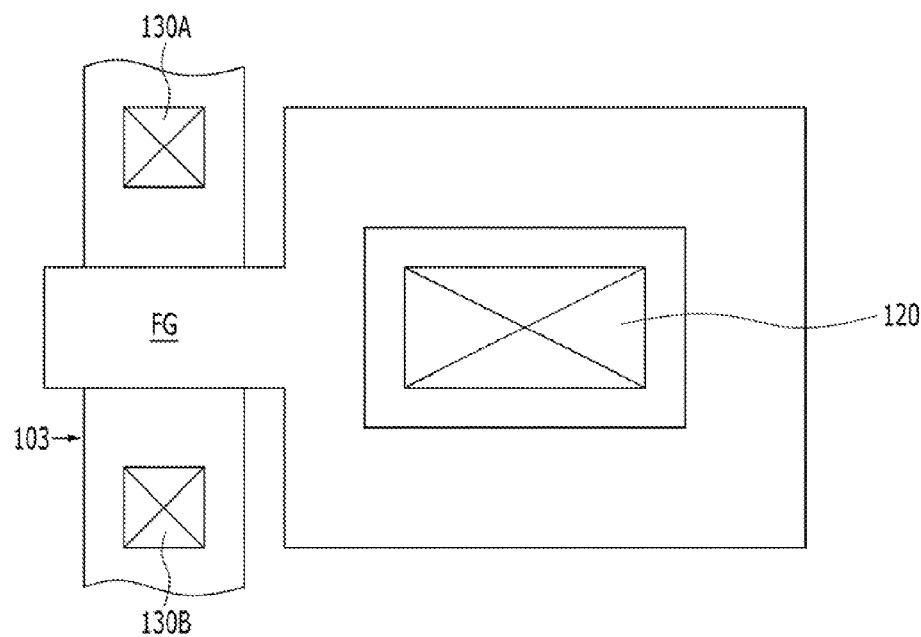
Figure 2D:
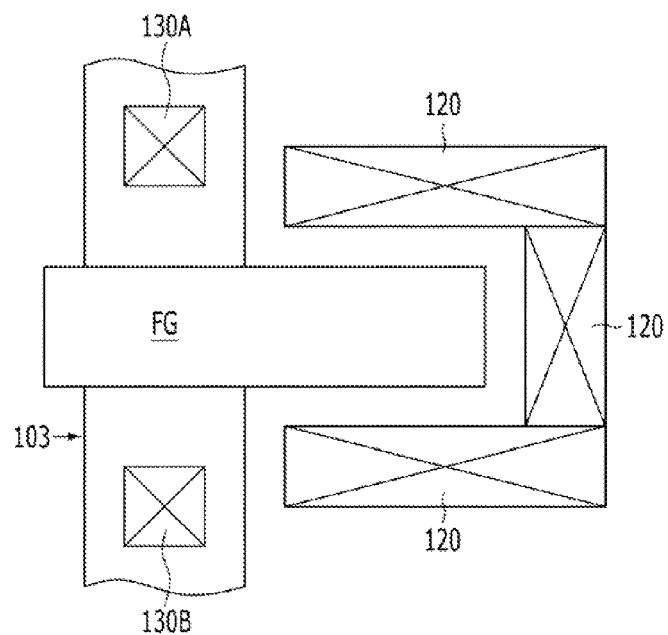
Figure 2E:
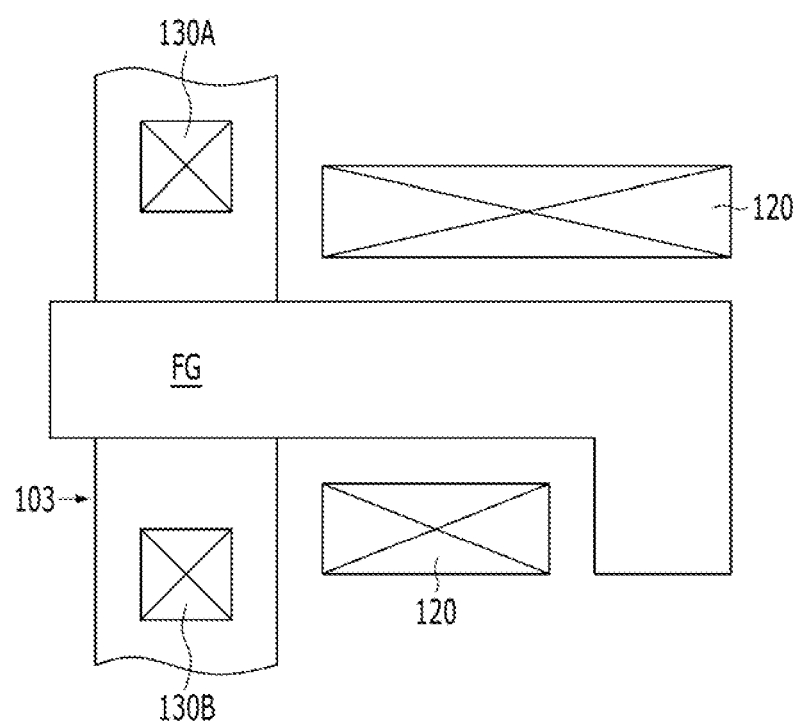

The control plug 120 may be formed simultaneously with the contact plug 130, and the control plug 120 may penetrate through the interlayer dielectric layer 109. The control plug 120 may include at least one plug having sidewalls that faces sidewalls of the floating gate FG. For example, the control plug 120 may include a single plug having at least one sidewall that faces the sidewall of the floating gate FG (FIGS. 1B, 2B and 2C), or a plurality of plugs each having at least two sidewalls that face the sidewalls of the floating gate FG (FIGS. 2A, 2D and 2E). The control plug 120 may have various geometrical shapes to improve the coupling ratio between the floating gate FG and the control plug 120. Herein, if an area of the sidewalls of the control plug 120 and the floating gate FG are increased, a coupling ratio between the control plug 120 and the floating gate FG may increase. As the coupling ratio increases, the integration degree of the non-volatile memory device may be easily improved.

In the exemplary non-volatile memory device, the floating gate FG stores logic information. The floating gate FG may be formed over the substrate 101 and may cross both the active region 103 and the isolation layer 102. The floating gate FG may be formed over the isolation layer 102 to have a portion extended onto the active region 103. The floating gate FG over the active region 103 may have a bar-shaped configuration, and the floating gate FG formed over the isolation layer 102 may have diverse geometrical shapes to increase the area of the sidewall that faces the control plug 120. Moreover, as the gap between the floating gate FG and the control plug 120, which is the line width of the gap 110, is decreased, the coupling ratio between the control plug 120 and the floating gate FG may be increased. Therefore, since the line width of the gap 110 is decreased as the integration degree of the non-volatile memory device is increased, the coupling ratio between the floating gate FG and the control plug 120 may be easily increased.

The floating gate FG may be a stacked structure where a tunnel insulation layer 106 (or a gate dielectric layer) and a gate conductive layer 107 are stacked. The tunnel insulation layer 106 may be a single layer, such as an oxide layer, a nitride layer, or an oxynitride layer, or a stacked layer, where at least two of the aforementioned layers are stacked. The gate conductive layer 107 may include a silicon-containing material. To be specific, the gate conductive layer 107 may be a single layer of polysilicon, or a stacked layer where a polysilicon layer and a silicide layer are stacked. The polysilicon layer may be a doped polysilicon layer that is doped with an impurity or an undoped polysilicon layer that is not doped with an impurity. Meanwhile, although the exemplary implementation describes a case where the floating gate FG has a planar gate structure, the floating gate FG may have a three-dimensional gate structure, for example, a fin gate structure.

In the exemplary non-volatile memory device, the first charge blocking layer 111, formed on the sidewalls of the floating gate FG, and the second charge blocking layer 112, formed on the sidewalls of the control plug 120, serve as a dielectric layer (e.g., inter-poly dielectric (IPD)) for insulating the floating gate FG and the control plug 120 from each other. Therefore, the first charge blocking layer 111 and the second charge blocking layer 112 may each include an insulation layer, which may be a single layer, such as an oxide layer, a nitride layer, and an oxynitride layer, or may each include a stacked layer where at least two of aforementioned layers are stacked. For example, each of the first charge blocking layer 111 and the second charge blocking layer 112 may be an ONO (Oxide-Nitride-Oxide) layer. The first charge blocking layer 111 may fill the gap 110, which is the space between the floating gate FG and the control plug 120. That is the first charge blocking layer 111 may be a spacer formed on the sidewalls of the floating gate FG. For example, the first charge blocking layer 111 may be formed through a gate spacer forming process of a CMOS process to protect the sidewalls of the floating gate FG. The second charge blocking layer 112 complements the function of the first charge blocking layer 111 and may continue to protect the sidewalls of the floating gate FG if the first charge blocking layer 111 loses its function due to a process variable. The second charge blocking layer 112 may be a spacer formed on the sidewalls of the control plug 120. The second charge blocking layer 112 may be formed selectively.

In the exemplary non-volatile memory device, the junction region 108, which may be a source region or a drain region of the second conductive type, may be formed through an ion implantation process. A silicide layer (not shown) may be interposed between the junction region 108 and the contact plug 130. The contact plug 130, which is formed over the junction region 108, may include a source contact plug 130A and a drain contact plug 130B, may penetrate through the interlayer dielectric layer 109, and may be formed simultaneously with the control plug 120. The second charge blocking layer 112 may be formed on the sidewalls of the source contact plug 130A and the drain contact plug 130B, as well. The second charge blocking layer 112 that is formed on the sidewalls of the source contact plug 130A and the drain contact plug 130B may function as a barrier layer.

In the exemplary non-volatile memory device the line width of the gap 110, which is the space between the control plug 120 and the floating gate FG, may be the same as or narrower than a gap 110A between the floating gate FG and the contact plug 130. For example, the control plug 120 may contact the first charge blocking layer 111 on the sidewall of the floating gate FG, through the second charge blocking layer 112, and the contact plug 130 may contact the first charge blocking layer 111 or be spaced out from the first charge blocking layer 111 with a predetermined gap 110A between them, through the second charge blocking layer 112. Also, an area where the floating gate FG and the contact plug 130 face each other may be smaller than the area of the sidewalls where the control plug 120 and the floating gate FG face each other. If the space and the area of the facing sidewalls between the floating gate FG and the contact plug 130 and between the floating gate FG and the control plug 120 are made different, the floating gate FG may be prevented from interference by the bias applied through the contact plug 130.

The exemplary non-volatile memory device having the above-described structure may have improved operation characteristics and integration degree by including the control plug 120 serving as a control gate.

Also, if the floating gate FG surrounds the control plug 120 or if the control plug 120 surrounds the floating gate FG floating gate FG, then the coupling ratio between them may be effectively increased. In addition, as the line width of the gap 110 between the floating gate FG and the control plug 120 decreases, the coupling ratio between them is increased. Therefore, the operation characteristics may be improved as the integration degree of the non-volatile memory device is increased.

Also, as the control plug 120 is disposed over the isolation layer 102, the control plug 120 is free from the polarity of the bias applied thereto. By taking advantage of the fact, the size of a peripheral circuit applying the bias to a memory cell may be reduced, and diverse known operation methods may be easily applied.

Also, the exemplary non-volatile memory device may be realized through a predetermined logic process without any additional operation. This will be described later in detail when an exemplary method of fabricating a non-volatile memory device is described with reference to FIGS. 3A to 3E.

Hereafter, an exemplary method of operating the non-volatile memory device is described with reference to FIGS. 1A to 1D and Table 1. Table 1 below presents an example of the operation condition of the non-volatile memory device in accordance with the implementation of the present invention. In Table 1, the "N-type" of the "channel column field denotes an N-type channel non-volatile memory device where the first conductive type is a P-type and the second conductive type is an N-type, whereas the "P-type" of the "channel" column denotes a P-type channel non-volatile memory device where the first conductive type is an N-type and the second conductive type is a P-type.

First of all, a program operation of the exemplary non-volatile memory device is described with reference to Table 1.

The program operation of the N-type channel non-volatile memory device may use a Hot Carrier Injection (HCI) method. For example, when the floating gate FG is coupled to a pumping voltage (VPP) terminal, a channel is formed on the surface of the active region 103 under the floating gate FG. When a ground voltage GND and a pumping voltage VPP are respectively applied to the source contact plug 130A and the drain contact plug 130B the channel is formed under the floating gate FG. While the channel is formed, the channel is pinched off due to the voltage level difference between the source contact plug 130A and the drain contact plug 130B. A program operation may be performed through a series of processes of generating hot electrons in the channel that is pinched off, and implanting the generated hot electrons into the floating gate FG. Herein, the pumping voltage VPP is a voltage obtained by boosting a power source voltage VCC which is applied from the outside. The program operation described above is performed easily even though the coupling ratio between the floating gate FG and the control plug 120 is small, compared with a Fowler-Nordheim (FN) tunneling.

Meanwhile, a program operation in a P-type channel non-volatile memory device in accordance with the implementation of the present invention may be performed using a Band-To-Band Tunneling (BTBT) method.

Subsequently, an erase operation of the exemplary non-volatile memory device is described with reference to Table 1.

The erase operation of the exemplary N-channel non-volatile memory device may use the BTBT method or the FN tunneling method. For example, if the erase operation is performed using the BTBT method, then BTBT occurs between the floating gate FG and the junction region 108 coupled to the drain contact plug 130B, when the pumping voltage VPP is applied to the drain contact plug 130B while the floating gate FG is coupled to a negative voltage by applying a negative pumping voltage −VPP to the control plug 120, and then holes are implanted into the floating gate FG that is coupled to the negative voltage. In particular, when electrons are implanted into the floating gate FG during the program operation, the floating gate FG itself already has a negative voltage level. Therefore, more holes are implanted into the floating gate FG to improve the erase operation characteristics.

If the erase operation is performed using the FN tunneling method, then the electrons in the floating gate FG are discharged by applying the pumping voltage VPP to one between the substrate 101, the isolated well 104 and the deep well 105 and taking advantage of the voltage level difference between them, while the floating gate FG is coupled to a

TABLE 1

| Channel | Operation | Scheme | Control Plug | Drain Contact Plug | Source Contact Plug | Substrate (or Well) |
|---|---|---|---|---|---|---|
| N-type | Program | HCI | VPP | VPP | GND | GND |
|  | Erase | BTBT | −VPP | VPP | GND | GND |
|  |  | FN tunneling | −VPP | GND/Floating | GND/Floating | VPP |
|  | Read | — | VCC | Vread (~1 V) | GND | GND |
| P-type | Program | BTBT | VPP | −VPP | GND | GND |
|  | Erase | FN tunneling | −VPP | GND/Floating | GND/Floating | VPP |
|  | Read | — | VCC | Vread (~1 V) | GND | GND | negative voltage by applying the negative pumping voltage −VPP to the control plug 120.

Meanwhile, the erase operation in the exemplary P-type channel non-volatile memory device may be performed using the FN tunneling method.

Hereafter, a read operation of the exemplary non-volatile memory device is described with reference to Table 1.

An exemplary N-type channel non-volatile memory device and an exemplary P-type channel non-volatile memory device may perform a read operation by applying a power source voltage to the control plug 120 to couple the floating gate FG to a power source voltage terminal and respectively applying a read voltage Vread and a ground voltage GND that are lower than the power source voltage to the drain contact plug 130B and the source contact plug 130A. The read voltage Vread may not be higher than approximately 1V.

Hereafter, a method for fabricating a non-volatile memory device having the above-described structure is exemplarily described with reference to FIGS. 3A to 3E to show that a non-volatile memory device in accordance with an implementation of the present invention may be formed without an additional process that is performed in addition to a logic process.

FIGS. 3A to 3E are cross-sectional views describing an exemplary method of fabricating a non-volatile memory device. Herein, the cross-sectional views of the non-volatile memory device are taken along a line A-A' and a line B-B' shown in FIG. 1B.

Figure 3A:
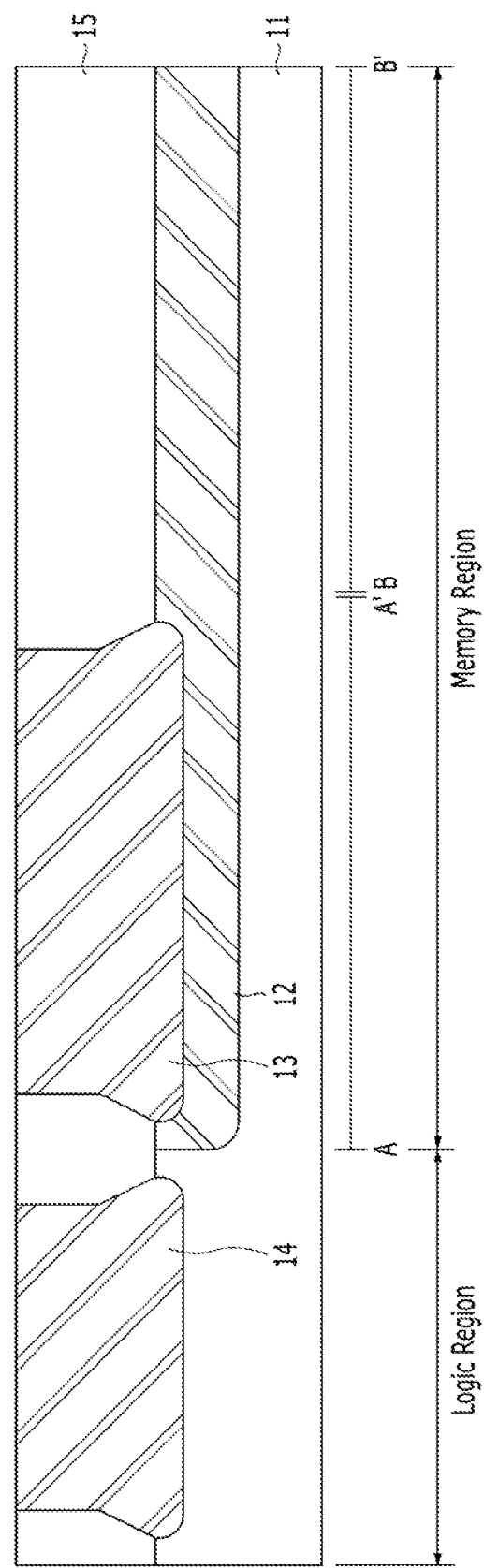
FIGS. 3A to 3E are cross-sectional views describing an exemplary method of fabricating a non-volatile memory device.
Figure 3B:
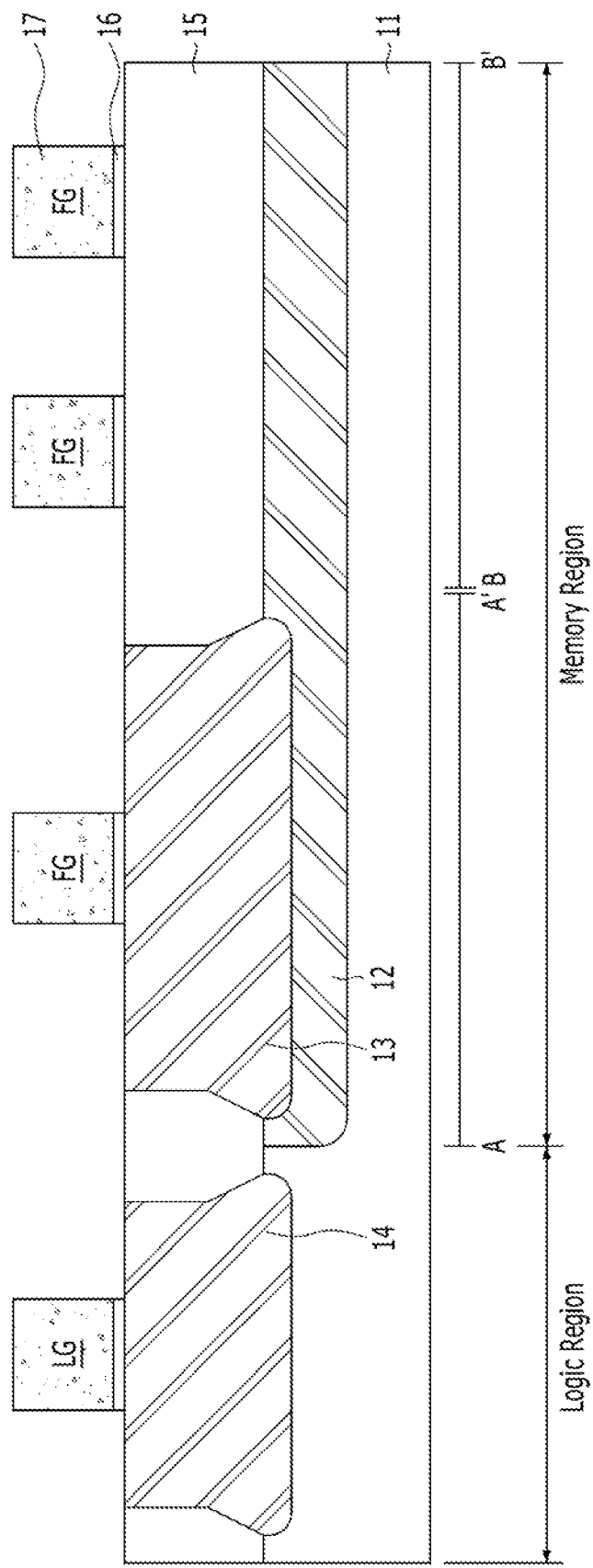

Referring to FIG. 3A, a substrate 11 including a logic region and a memory region is provided. The logic region may include a CMOS region, which may include an NMOS region and a PMOS region. This exemplary implementation illustrates a case where NMOS is formed in the logic region, in other words, a case where the logic region is an NMOS region. The substrate 11 may be a semiconductor substrate. The semiconductor substrate may be of a monocrystalline state, and may include a silicon-containing material. In short, the semiconductor substrate may include a monocrystalline silicon-containing material. For example, a bulk silicon substrate or a Silicon On Insulator (SOI) substrate may be used as the substrate 11.

Subsequently, a deep well 12 of a second conductive type and an isolation well 13 of a first conductive type are formed in a memory region of the substrate 11, and a logic well 14 of the first conductive type may be formed in a logic region of the substrate 11. The logic well 14, the isolation well 13, and the deep well 12 may be formed through a series of processes of forming a mask pattern (not shown) over the substrate 11, ion-implanting an impurity into the substrate 11 by using the mask pattern as a barrier to the ion implantation, and performing an annealing process to activate the implanted impurity.

Subsequently, an isolation layer 15 may be formed over the substrate 11. The isolation layer 15 may be formed through a Shallow Trench Isolation (STI) process. The STI process may be performed by forming trenches for isolation in the substrate 11 and filling the trenches with an insulation substance.

Referring to FIG. 38, a gate dielectric layer 16 may be formed over the substrate 11. The gate dielectric layer 16 may be a single layer, such as an oxide layer, a nitride layer, and an oxynitride layer, or a stacked layer including at least two of the aforementioned layers.

Subsequently, a gate conductive layer 17 may be formed over the gate dielectric layer 16. The gate conductive layer 17 may be formed of a silicon-containing material, e.g., a silicon layer. For example, the gate conductive layer 17 may be a polysilicon layer.

A predetermined impurity may be ion-implanted into the gate conductive layer 17 corresponding to each of the logic region and the memory region in order to control the characteristics (e.g., work function) of the gate conductive layer 17 that are required by the regions.

Subsequently, a mask pattern (not shown) is formed over the gate conductive layer 17 and then a plurality of gates LG and FG may be formed by using the mask pattern as an etch barrier and sequentially etching the gate conductive layer 17 and the gate dielectric layer 16. To be specific, a floating gate FG may be formed in the memory region simultaneously when a logic gate LG is formed in the logic region. The floating gate FG may have diverse geometrical shapes (refer to FIGS. 1B, and 2A to 2E).

Figure 3C:
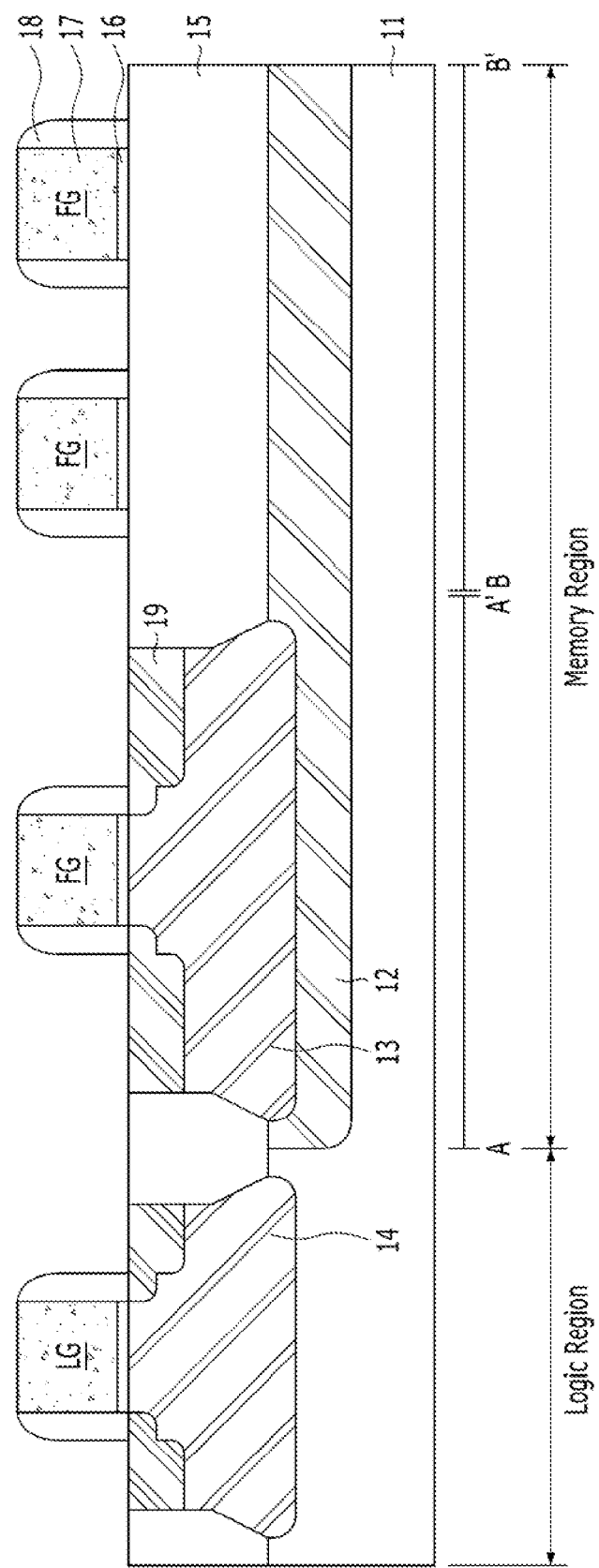

Referring to FIG. 3C, first spacers 18 may be formed on both sidewalls of each of the logic gate LG and the floating gate FG. The first spacers 18 may function as a charge blocking layer for insulating the floating gate FG and a control plug (to be formed in a subsequent process) from each other. The first spacers 18 may be an insulating layer, and may be formed of a single layer, such as an oxide layer, a nitride layer, or an oxynitride layer. Alternatively, the first spacers 18 may be a stacked layer including at least two of the aforementioned layers. For example, the first spacers 18 may be an ONO (Oxide-Nitride-Oxide) layer.

Subsequently, a junction region 19 may be formed in the substrate 11 on both sides of each of the logic gate LG and the floating gate FG. The junction region 19, which is a source region and a drain region, may be formed by ion-implanting an impurity of a conductive type that is complementary to the conductive types of the isolation well 13 and the logic well 14. The junction region 19 may be formed in a lightly doped drain (LDD) structure.

Meanwhile, after the junction region 19 is formed, a silicide layer (not shown) may be formed on the surfaces of the floating gates FG and the logic gates LG and the surfaces of the junction region 19. Alternatively, a silicide layer (not shown) may be formed only on the surface of the junction region 19.

Figure 3D:
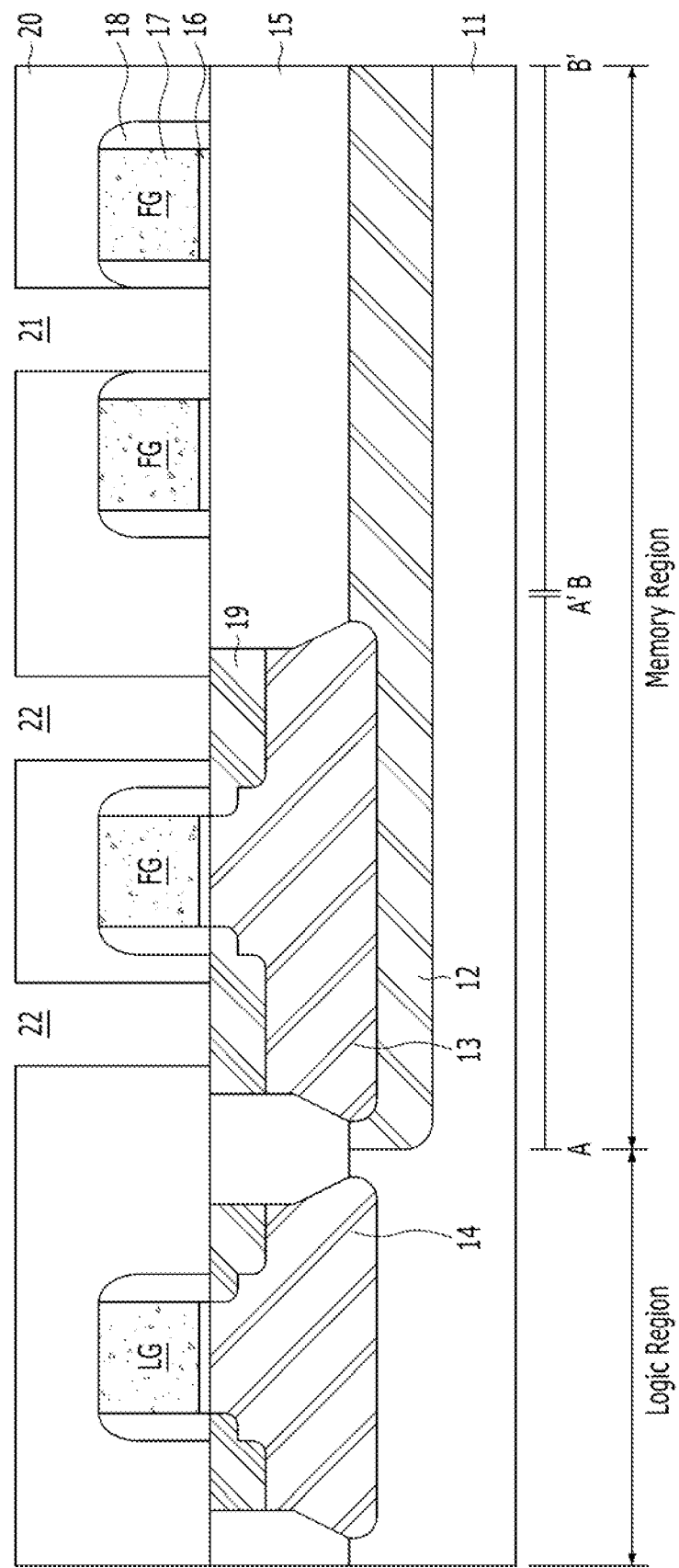

Referring to FIG. 3D, an interlayer dielectric layer (not shown) may be formed over the substrate 11. The interlayer dielectric layer may be formed to cover the floating gate FG and the logic gate LG. After the interlayer dielectric layer is formed, a predetermined process (for example, a Chemical Mechanical Polishing (CMP) process) may be performed to remove the step height formed by the floating gate FG and the logic gate LG.

Subsequently, a mask pattern (not shown) may be formed over the interlayer dielectric layer to simultaneously form, by etching the interlayer dielectric layer using the mask pattern as an etch barrier, contact holes 22 that expose the junction region 19 and an opening 21 that exposes the first spacers 18 on the sidewalls of the floating gate FG over the isolation layer 15. Hereinafter, reference numeral "20" indicates an interlayer dielectric layer pattern. The opening 21 may have diverse geometrical shapes according to the shape of the pre-formed floating gate FG (FIG. 1B, and FIGS. 2A to 2E).

Figure 3E:
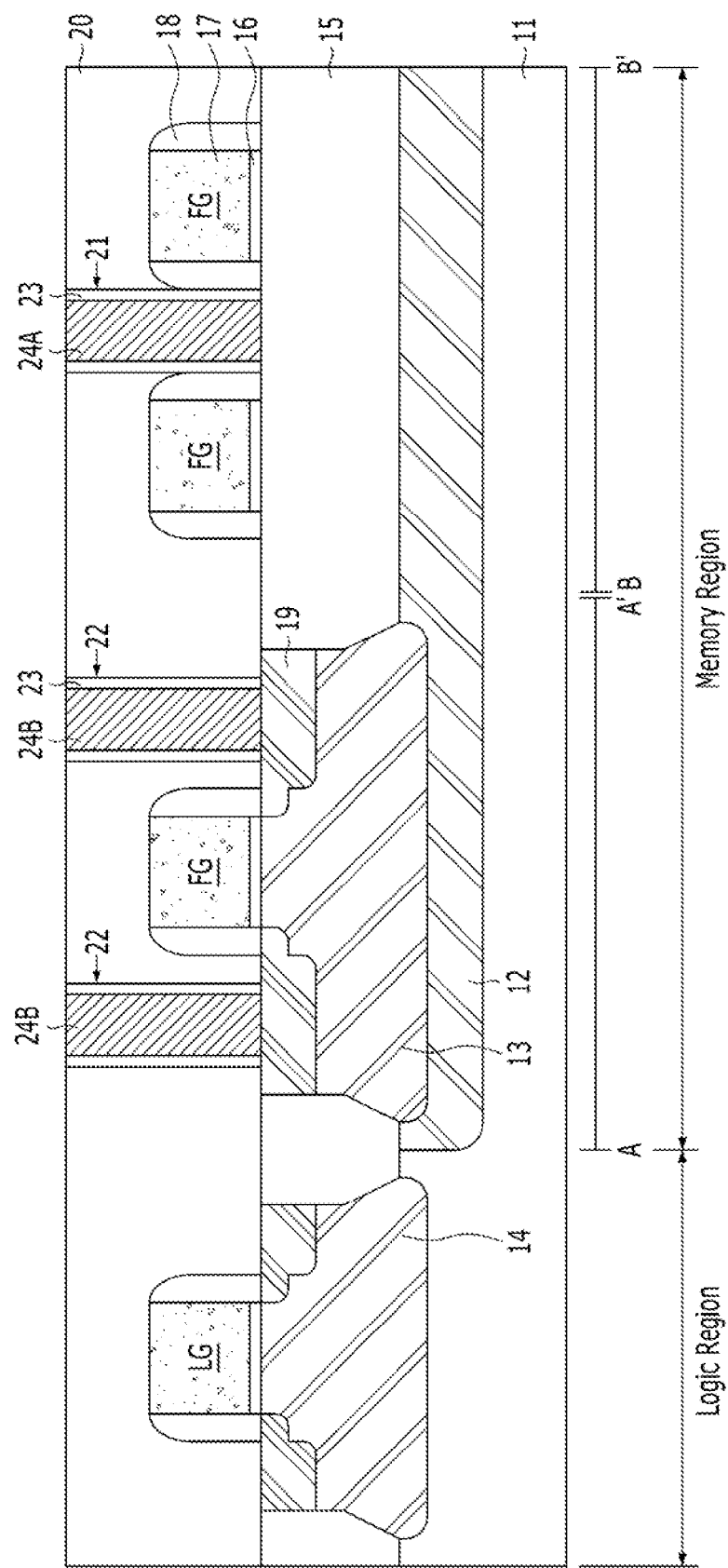

Referring to FIG. 3E, second spacers 23 may be formed on the sidewalls of the interlayer dielectric layer pattern defining the contact holes 22 and the opening 21. (hereinafter referred to as sidewalls of the contact holes 22 and the opening 21) The second spacers 23 formed on the sidewalls of the contact holes 22 and the opening 21 may function as a barrier layer. Also, the second spacers 23 formed on the sidewalls of the opening 21 may serve as a charge blocking layer for insulating the floating gate FG and a control plug (to be formed in a subsequent process) from each other. The second spacers 23 may be formed of an insulation layer, and the second spacers 23 may be a single layer, such as an oxide layer, a nitride layer, and an oxynitride layer. Alternatively, the second spacers 23 may be a stacked layer including at least two of the aforementioned layers.

Subsequently, contact plugs 24B may be formed in the contact holes 22 and a control plug 24A may be formed in the opening 21. The contact plugs 24B and the control plug 24A may be simultaneously formed by forming a conductive layer over the substrate structure to fill the contact holes 22 and the opening 21, and by performing a planarization process until the interlayer dielectric layer pattern 20 is exposed. The planarization process may be a Chemical Mechanical Polishing process.

Subsequently, although not illustrated in the drawing, the fabrication of the non-volatile memory device in accordance with the implementation of the present invention may be completed through a known semiconductor fabrication technology.

As described above, the exemplary non-volatile memory device may be realized to include the floating gate FG, the charge blocking layer, and the control plugs 24A through the predetermined logic process alone without performing an additional process.

Figure 4:
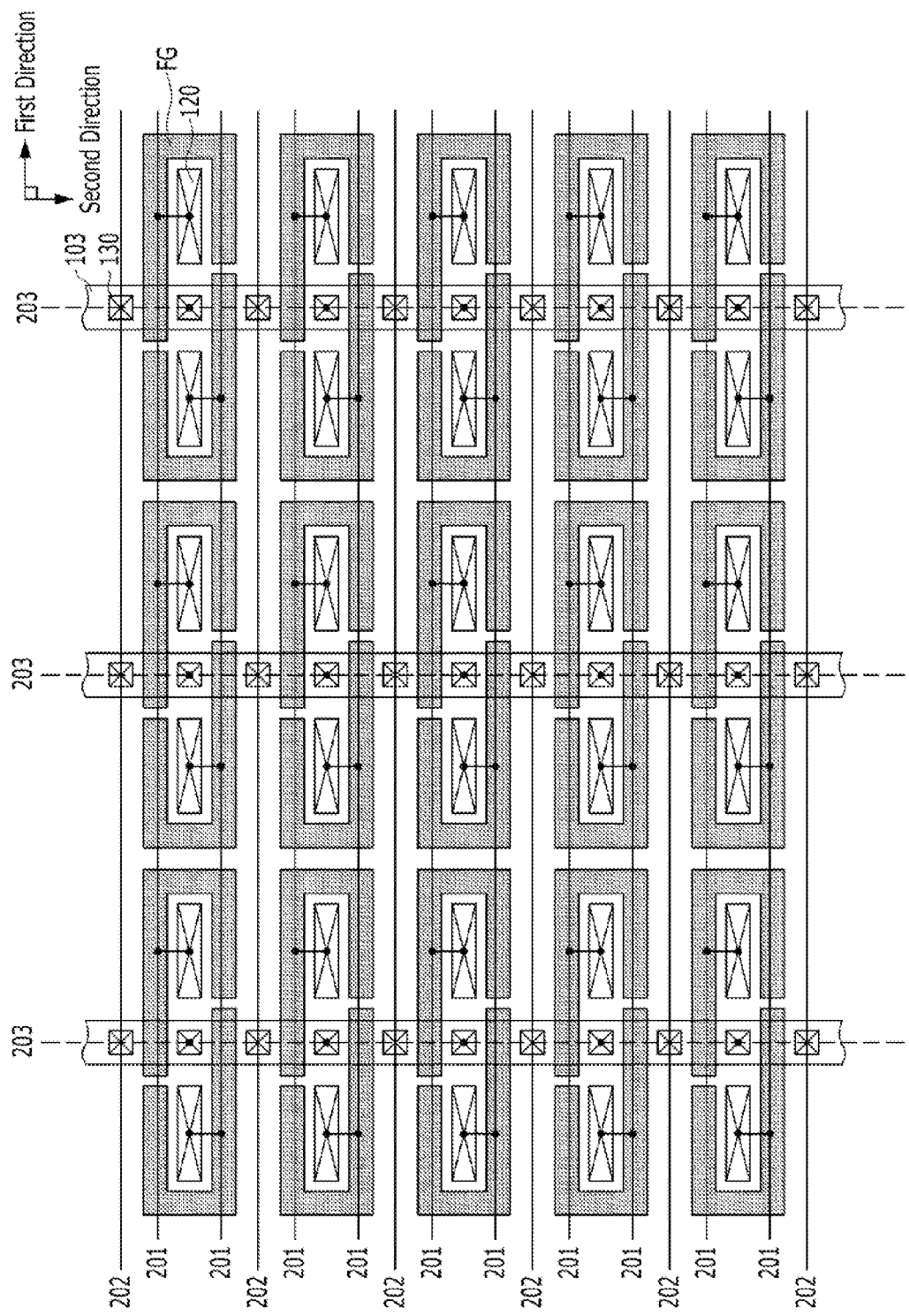
FIG. 4 is a plan view illustrating a cell array of an exemplary non-volatile memory device.

FIG. 4 is a plan view illustrating a cell array of an exemplary non-volatile memory device. For the sake of convenience in description, the unit cells of the cell array of the non-volatile memory device adopt the reference numerals appearing in FIGS. 1A to 1D, and description on the structures using the same reference numerals are omitted herein.

Referring to FIG. 4, the cell array of the exemplary non-volatile memory may include a plurality of line-type active regions 103 that may extend in a second direction and are arranged, in parallel, in a first direction. The plurality of line-type active regions 103 are spaced from each other in the first direction by gaps. Control plugs 120 may be disposed over an isolation layer and may be symmetrical arranged on opposite sides of each active region, of the plurality of active regions 103.

A floating gate FG may be disposed over an isolation layer and around each of the control plugs 120. The floating gates FG may be adjacent to a corresponding control plug 120, of the plurality of control plus, and may be separated from the corresponding control plug by a certain gap. The floating gate FG may surround the corresponding control plug 120, and may extend onto a corresponding active region 103. Herein, the floating gate FG may be asymmetrically arranged in the first direction with respect to the corresponding active region 103.

Contact plugs 130 may be disposed (in the second direction) over the active regions 103 between the floating gates FG, and junction regions are formed in the active regions 103 under the contact plugs 130.

A plurality of word lines 201 may extend in the first direction across the active regions 103. The plurality of word lines 201 may be arranged, in parallel, in a second direction and be separated from each other by gaps. The word lines 201 may be the lowermost metal lines, e.g., M1, in a semiconductor device having a multi-metal line structure. The control plugs 120, which are disposed on one side based of each active region 103 may be coupled with an $N^{th}$ word line 201, where N is a natural number, and the control plugs 120 disposed on another other side of each active region 103 may be coupled with an $(N+1)^{th}$ word line 201, where N is a natural number.

A plurality of source lines 202 may extend in the first direction across the active regions 103. The plurality of source lines 202 may be arranged, in parallel, in the second direction and be separated by a gap. Similar to the word lines 201, the source lines 202 may be the lowermost metal lines, e.g., M1, in a semiconductor device having a multi-metal line structure, and one source line 202 may be disposed between word line groups each of which is formed of two word lines 201.

A plurality of line-type bit lines 203 may extend in the second direction and may be separated from each other in the first direction by gaps. The bit lines 203 may be metal lines, e.g., M2, disposed over the lowermost metal lines in the semiconductor device having a multi-metal line structure. The bit lines 203 may be coupled with the contact plugs 130 disposed between the control plugs 120 that are symmetrical in the right and left.

The integration degree of the non-volatile memory device described above may be effectively improved because the floating gates FG surrounding the control plugs 120 have an asymmetrical form based on the active regions 103.

Figure 5A:
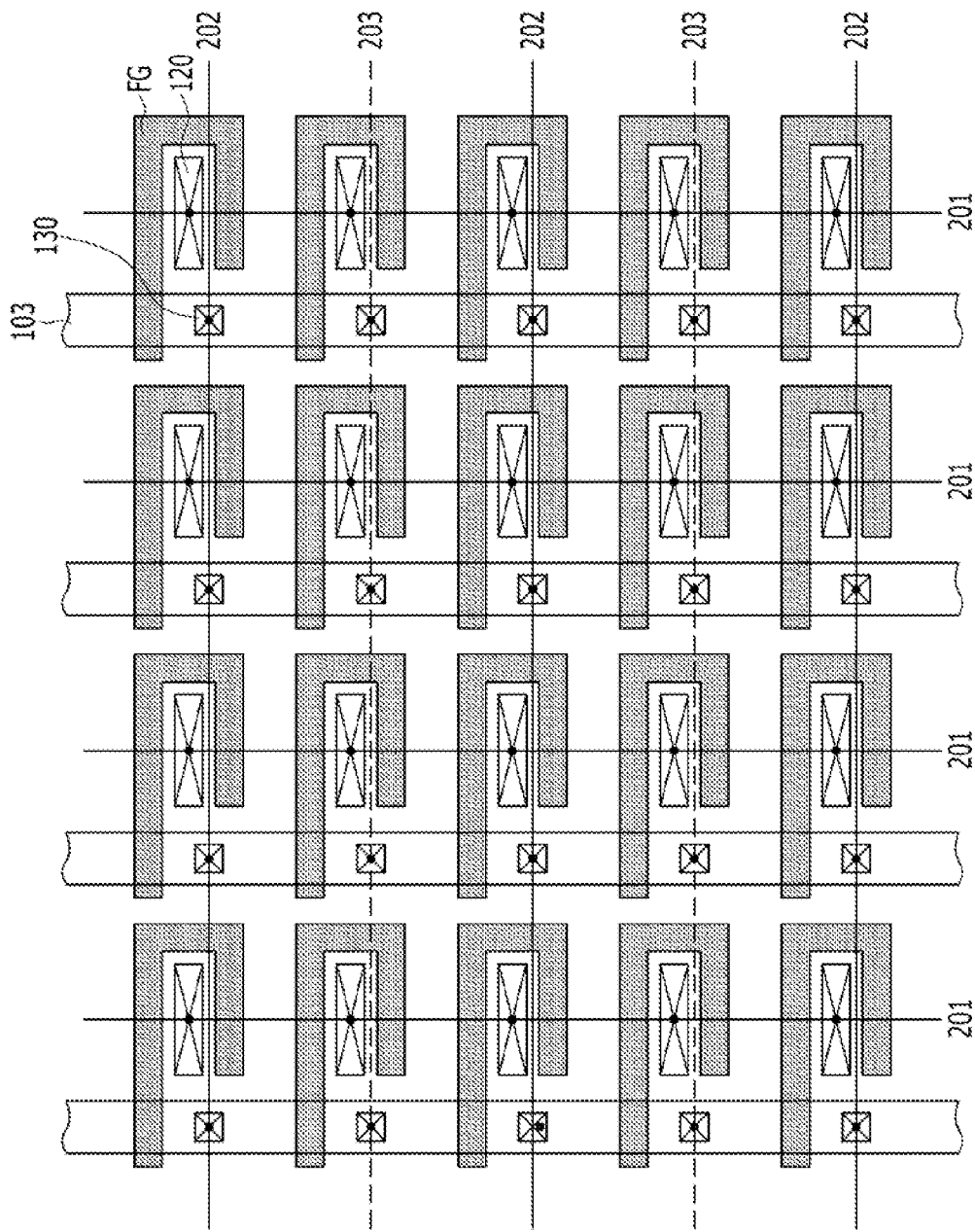
FIGS. 5A and 5B are plan views illustrating modified examples of a cell array of an exemplary non-volatile memory device.
Figure 5B:
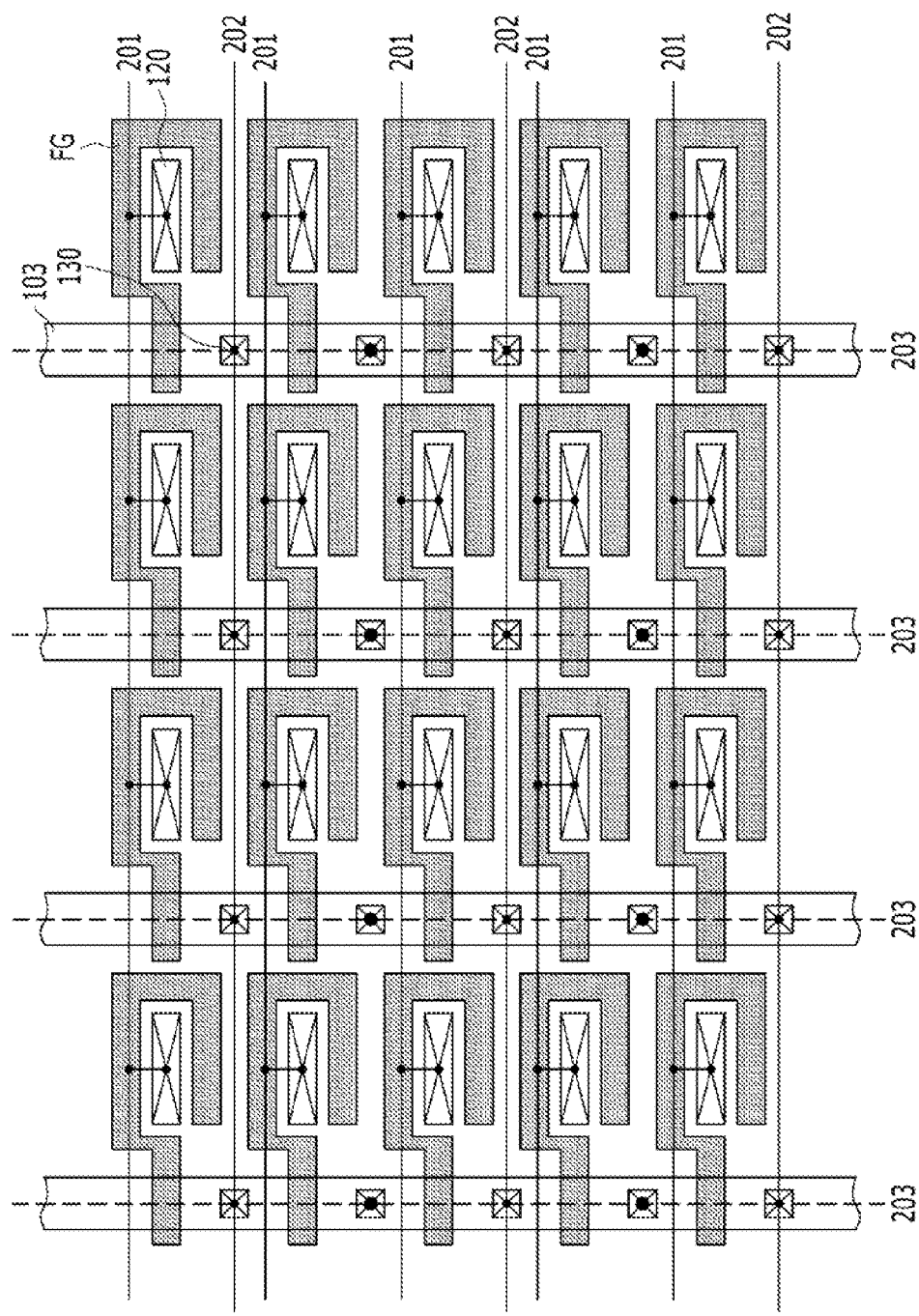

FIGS. 5A and 5B are plan views illustrating modified examples of a cell array of an exemplary non-volatile memory device. Description on the structures denoted as the same reference numerals appearing in FIG. 4 is omitted herein.

FIGS. 5A and 5B respectively show cell arrays where the unit cells of FIGS. 1B and 2B are disposed in a form of matrix. The dispositions of word lines 201, source lines 202 and bit lines 203 are different.

Referring to FIG. 5A, the cell array of an exemplary non-volatile memory device may include the source lines 202 and the bit lines 203 extending in a same direction and the word lines 201 crossing the source lines 202 and the bit lines 203. In an alternative implementation, the directions that the source lines 202, the bit lines, and the word lines 201 extend may be switched. The source lines 202 and the bit lines 203 may be disposed in the same layer in a semiconductor device having multiple metal lines, and the word lines 201 may be disposed in a different layer from the layer where the source lines 202 and the bit lines 203 are disposed.

Referring to FIG. 58, the cell array of an non-volatile memory device may include the source lines 202 and the word lines 201 extending in the same direction and the bit lines 203 crossing the source lines 202 and the word lines 201. Two word lines 201 and one source line 202 may be disposed alternately in the direction that the bit lines 203 are stretched. Herein, the source lines 202 and the word lines 201 may be disposed in the same layer in a semiconductor device having multiple metal lines, and the bit lines 203 may be disposed in a different layer from the layer where the source lines 202 and the word lines 201 are disposed.

As described above, an exemplary non-volatile memory device may have diverse cell arrays easily realized in a limited area.

Figure 6:
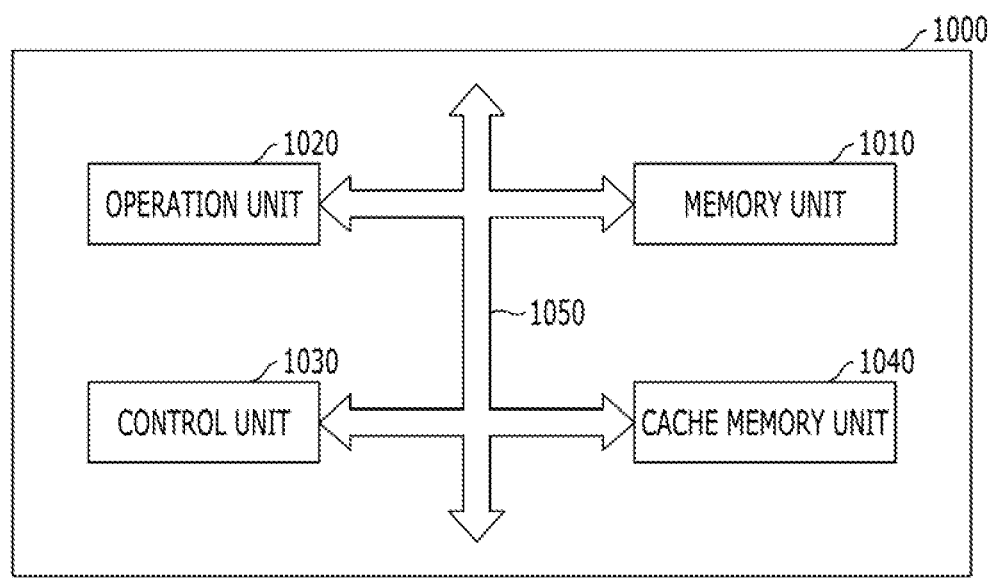
FIG. 6 is a configuration diagram of an exemplary microprocessor.

FIG. 6 is a configuration diagram of a microprocessor in accordance with an exemplary implementation.

Referring to FIG. 6, a microprocessor 1000 may perform tasks for controlling and tuning a series of processes of receiving data from various external devices, processing the data, and outputting processing results to an external device. The microprocessor 1000 may include a memory unit 1010, an operation unit 1020, or a control unit 1030. The microprocessor 1000 may be implemented, for example, as a central processing unit (CPU), a graphic processing unit (GPU), a digital signal processor (DSP), or an application processor (AP).

The memory unit 1010 may store data in the microprocessor 1000, such as a processor register or a register. The memory unit 1010 may include a register, such as a data register, an address register, or a floating point register. The memory unit 1010 may temporarily store data an operation that is to be performed by the operation unit 1020, may store data resulting from the performance of the operation, or may store an address where data to perform the operation is stored.

The memory unit 1010 may include the above-described non-volatile memory device in accordance with the implementations. The memory unit 1010 may include a control plug formed over a substrate, a floating gate formed over the substrate to be adjacent to the control plug with a gap therebetween and surround the control plug, and a charge blocking layer formed on a sidewall of the floating gate to fill the gap. The memory unit 1010 having the above-described structure may realize a predetermined logic process without performing any additional process. The memory unit 1010 having the above-described structure may improve operation characteristics and integration degree and simultaneously increase logic compatibility by forming control plugs serving as a control gate. The memory unit 1010 having the above-described structure may easily utilize various known methods. Accordingly, both of the memory unit 1010 and the microprocessor 1000 including the memory unit 1010 may achieve miniaturization and high performance.

The operation unit 1020 may perform an operation in the microprocessor 1000. The operation unit 1020 may perform an arithmetical operation or a logical operation based on a signal communicated from the control unit 1030. The operation unit 1020 may include at least one arithmetic logic unit (ALU).

The control unit 1030 may receive a signal from the memory unit 1010, the operation unit 1020, or an external device of the microprocessor 1000. The control unit 1030 may perform extraction and decoding commands, may perform control input and output, and may execute processing represented by a program.

The microprocessor 1000, according to an exemplary implementation, may additionally include a cache memory unit 1040 that can temporarily store data inputted from an external device or that is to be outputted to an external device. In this case, the cache memory unit 1040 may exchange data with the memory unit 1010, the operation unit 1020, or the control unit 1030 through a bus interface 1050.

FIG. 7 is a configuration diagram of an exemplary processor.

Referring to FIG. 7, a processor 1100 may improve performance and realize multi-functionality by including various functions in addition to the function which is performed by a microprocessor such as controlling and tuning a series of processes of receiving data from various external devices, processing the data, and outputting processing results to an external device. The processor 1100 may include a core unit 1110, a cache memory unit 1120, or a bus interface 1130. The core unit 1110, of an exemplary implementation, may perform an arithmetic logic operation on data inputted from an external device, and may include a memory unit 1111, an operation unit 1112, or a control unit 1113. The processor 1100 may be, for example, a system-on-chips (SoCs), such as a multi-core processor, a graphic processing unit (GPU), an application processor (AP), or the like.

The memory unit 1111 may store data in the processor 1100, as a processor register or a register. The memory unit 1111 may include a register, such as a data register, an address register, or a floating point register. The memory unit 1111 may temporarily store (i) data for which an operation is to be performed by the operation unit 1112, (ii) result data obtained by performing the operation, or (iii) an address where the data for performing of the operation is stored. The operation unit 1112 may perform an operation in the processor 1100. The operation unit 1112 may perform an arithmetical operations or a logical operation based on a signal from the control unit 1113. The operation unit 1112 may include at least one arithmetic logic unit (ALU). The control unit 1113 may receive a signal from the memory unit 1111, the operation unit 1112, or an external device of the processor 1100, perform extraction and decoding commands, control input and output, and may execute processing represented by a program.

The cache memory unit 1120 may temporarily store data to compensate for a difference in a data processing speed between the core unit 1110, which operates at a high speed, and an external device that operates at a low speed. The cache memory unit 1120 may include a primary storage section 1121, a secondary storage section 1122, or a tertiary storage section 1123. In general, the cache memory unit 1120 may include the primary and secondary storage sections 1121 and 1122, and may include the tertiary storage section 1123 in order to properly cope with a situation where high storage capacity is required. When appropriate, the cache memory unit 1120 may include an increased number of storage sections. That is to say, the number of storage sections that are included in the cache memory unit 1120 may be changed according to a design. The speeds at which the primary, secondary, and tertiary storage sections 1121, 1122 and 1123 store and discriminate data may be the same or different. In the case where the speeds of the respective storage sections 1121, 1122 and 1123 are different, the speed of the primary storage section 1121 may be set to be fastest. Although this exemplary configuration shows that the primary, secondary, and tertiary storage sections 1121, 1122 and 1123 are provided inside the cache memory unit 1120, in an alternative implementation, the primary storage sections 1121 of the cache memory unit 1120 may be provided inside the core unit 1110. To enhance data processing speed, the secondary and tertiary storage sections 1122 and 1123 may be provided outside the core unit 1110.

The bus interface 1130 may connect the core unit 1110 and the cache memory unit 1120 and may allow data to be efficiently communicated.

The exemplary processor 1100 may include a plurality of core units 1110, and the plurality of core units 1110 may share the same cache memory unit 1120. The plurality of core units 1110 and the cache memory unit 1120 may be connected through the bus interface 1130. The plurality of core units 1110 may be configured in substantially the same way as the above-described configuration of the core unit 1110. In an implementation where the processor 1100 may include the plurality of core unit 1110, the primary storage section 1121 of each core unit 1110 may be configured to correspond to the number of the plurality of core units 1110, and the secondary storage section 1122 and the tertiary storage section 1123 may be configured outside the plurality of core units 1110 and may be shared through the bus interface 1130. The processing speed of the primary storage section 1121 may be faster than the processing speeds of the secondary and tertiary storage section 1122 and 1123.

The exemplary processor 1100 may further include an embedded memory unit 1140 to store data, a communication module unit 1150 to communicate data to and from an external device in a wired or wireless manner, a memory control unit 1160 to drive an external memory device, or a media processing unit 1170 to process the data processed in the processor 1100 or the data inputted from an external input device and to output the processed data to an external interface device. The processor 1100 may include a plurality of modules. In this case, the plurality of modules that are added may exchange data, via the bus interface 1130, with the core units 1110, the cache memory unit 1120.

The embedded memory unit 1140 may include not only a volatile memory but also a nonvolatile memory. The volatile memory may include, for example, a dynamic random access memory (DRAM), a mobile DRAM, a static random access memory (SRAM), and so on. The nonvolatile memory may include, for example, a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), and so on. In particular, the nonvolatile memory may include the above-described non-volatile memory device in accordance with the implementations. The embedded memory unit 1140 having the above-described structure may include a control plug formed over a substrate, a floating gate formed over the substrate to be adjacent to the control plug with a gap therebetween and surround the control plug, and a charge blocking layer formed on a sidewall of the floating gate to fill the gap. The embedded memory unit 1140 having the above-described structure may realize a predetermined logic process without performing any additional process. The embedded memory unit 1140 having the above-described structure may improve operation characteristics and integration degree and simultaneously increase logic compatibility by forming control plugs serving as a control gate. The embedded memory unit 1140 having the above-described structure may easily utilize various known methods. Accordingly, both of the embedded memory unit 1140 and the processor 1100 including the embedded memory unit 1140 may achieve miniaturization and high performance.

The communication module unit 1150 may include a module capable of being connected with a wired network or a module capable of being connected with a wireless network. The wired network module may include, for example, a local area network (LAN), a universal serial bus (USB), an Ethernet, power line communication (PLC), and so on. The wireless network module may include, for example, Infrared Data Association (IrDA), code division multiple access (CDMA), a time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and so on.

The memory control unit 1160 may control data communicated between the processor 1100 and an external storage device operating according to a different communication standard. The memory control unit 1160 may include, for example, a memory controller, for example, a controller for controlling IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted from the external input device, and may output the processed data to the external interface device to be communicated as an image, a voice, or in another format. The media processing unit 1170 may include, for example, a graphic processing unit (GPU), a digital signal processor (DSP), a high definition audio (HD audio), a high definition multimedia interface (HDMI) controller, and so on.

According to an exemplary implementation of the present invention, operation characteristics and integration degree of a non-volatile memory device may be improved by forming control plugs serving as a control gate.

Also, as floating gates surround control plugs, the coupling ratio between the floating gates and the control plugs may be effectively increased. Moreover, as the line width of the gap between the floating gates and the control plugs is decreased, the coupling ratio between them is increased. Therefore, the operation characteristics may be improved.

Also, since the control plugs are disposed over an isolation layer, they are free from the polarity of bias applied to the control plugs. Therefore, the size of a peripheral circuit for supplying the bias to memory cells may be reduced, and diverse known operation methods may be readily applied.

In addition, the non-volatile memory device having the above-described structure may realize a predetermined logic process without performing any additional process.

While the present invention has been described with respect to the specific implementations, it will be apparent to those skilled in the art that various changes and modifications may be made without departing from the spirit and scope of the invention as defined in the following claims.

What is claimed is:

1. A non-volatile memory device comprising:
an isolation layer formed in a substrate to define an active region;
a control plug formed over the isolation layer;
a floating gate formed over the isolation layer and being separated from the control plug by a first gap, and the floating gate extending over the active region;
a junction region formed in the active region and on both sides of the floating gate; and
contact plugs formed over the junction regions, where each of the contact plugs is separated from the floating gate by a second gap and a width of the first gap is smaller than a width of the second gap,
wherein the control plug only overlaps with the isolation layer and the floating gate overlaps with both the isolation layer and the active region, and
the floating gate is bent to have a first portion which extends in a first direction and a second portion which is in contact with the first portion and extends in a second direction crossing the first direction, where the first portion and the second portion of the floating gate face different sidewalls of the control plug, respectively.

2. The non-volatile memory device of claim 1, further comprising:
   a first charge blocking layer formed over sidewalls of the flowing gate; and
   a second charge blocking layer formed over sidewalls of the control plug and the contact plugs.

3. The non-volatile memory device of claim 2, wherein the first charge blocking layer and the second charge blocking layer are spacers.

4. The non-volatile memory device of claim 1, wherein areas of facing sidewalls of the floating gate and the control plug are greater than areas of facing sidewalls of the floating gate and the contact plug.

5. The non-volatile memory device of claim 1, wherein the control plug includes at least two plugs having sidewalls facing the sidewalls of the floating gate.

6. The non-volatile memory device of claim 1, wherein the floating gate is controlled in response to a bias applied to the control plug.

7. The non-volatile memory device of claim 1, wherein the first gap is filled with a double-layered insulating structure and the second gap is filled with a triple-layered insulating structure.

8. The non-volatile memory device of claim 2, wherein the first charge blocking layer and the second charge blocking layer fills the first gap while not filling the second gap.

9. The non-volatile memory device of claim 8, further comprising:
   an insulating layer interposed between the first charge blocking layer and the second charge blocking layer to fill a remaining space of the second gap.

10. A non-volatile memory device comprising:
    an isolation layer formed in a substrate to define a plurality of active regions;
    a plurality of control plugs symmetrically arranged, over the isolation layer, with respect to the plurality of active regions;
    a plurality of floating gates asymmetrically arranged with respect to the plurality of active regions, each floating gate, of the plurality of floating gates, and being separated from a corresponding control plug by a first gap, and each floating gate, of the plurality of floating gates, extending over a corresponding active region;
    a plurality of junction regions formed in each active region, of the plurality of active regions, between the plurality of floating gates; and
    a contact plug formed over each junction region, of the plurality of junction regions where the contact plug is separated from each floating gate by a second gap and a width of the first gap is smaller than a width of the second gap,
    wherein the plurality of control plugs only overlap with the isolation layer, and each floating gate, of the plurality of floating gates, overlaps with both the isolation layer and the corresponding active region, and
    each floating gate is bent to have a first portion which extends in a first direction and a second portion which is in contact with the first portion and extends in a second direction crossing the first direction, where the first portion and the second portion of each floating gate face different sidewalls of the corresponding control plug, respectively.

11. The non-volatile memory device of claim 10, further comprising:
    a first charge blocking layer formed over sidewalls of each floating gate; and
    a second charge blocking layer formed on the sidewalls of each control plug.

12. The non-volatile memory device of claim 10, wherein areas of facing sidewalls of each floating gate, of the plurality of floating gates, and each control plug, of the plurality of control plugs, are greater than areas of facing sidewalls of each floating gate, of the plurality of floating gates, and each contact plug.

13. The non-volatile memory device of claim 10, wherein each floating gate, of the plurality of floating gates, has sidewalls facing a portion of or entire sidewalls of each control plug.

14. The non-volatile memory device of claim 10, wherein each control plug includes at least two plugs having sidewalls facing the sidewalls of each floating gate, of the plurality of floating gates.

15. The non-volatile memory device of claim 10, wherein the plurality of floating gates are controlled in response to a bias applied to the plurality of control plugs.

16. The non-volatile memory device of claim 11, wherein the first charge blocking layer and the second charge blocking layer fills the first gap while not filling the second gap.

17. The non-volatile memory device of claim 16, further comprising:
    an insulating layer interposed between the first charge blocking layer and the second charge blocking layer to fill a remaining space of the second gap.

18. The non-volatile memory device of claim 10, wherein the first gap is filled with a double-layered insulating structure and the second gap is filled with a triple-layered insulating structure.

* * * * *